US009092200B2

(12) United States Patent
Richard et al.

(10) Patent No.: US 9,092,200 B2
(45) Date of Patent: Jul. 28, 2015

(54) DISPLAY DEVICE

(75) Inventors: Owen Richard, Fort Collins, CO (US); Jonathan D Bassett, Fort Collins, CO (US); David Quijano, Fort Collins, CO (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 198 days.

(21) Appl. No.: 13/490,993

(22) Filed: Jun. 7, 2012

(65) Prior Publication Data

US 2013/0176672 A1 Jul. 11, 2013

Related U.S. Application Data

(63) Continuation of application No. PCT/US2012/020797, filed on Jan. 10, 2012.

(51) Int. Cl.

| | |
|---|---|
| ***H05K 5/00*** | (2006.01) |
| ***H05K 7/00*** | (2006.01) |
| ***G06F 1/18*** | (2006.01) |
| ***F16M 11/10*** | (2006.01) |
| ***F16M 11/24*** | (2006.01) |
| ***G06F 1/16*** | (2006.01) |

(52) U.S. Cl.

CPC ............... *G06F 1/181* (2013.01); *F16M 11/10* (2013.01); *F16M 11/24* (2013.01); *G06F 1/1616* (2013.01)

(58) Field of Classification Search

USPC ............... 361/679.21, 679.22, 679.3, 679.56, 361/679.57, 679.58; 349/58, 59, 60

See application file for complete search history.

(56) References Cited

U.S. PATENT DOCUMENTS

| | | | | |
|---|---|---|---|---|
| 4,736,332 | A * | 4/1988 | Crease | 361/679.09 |
| 5,157,585 | A * | 10/1992 | Myers | 361/679.17 |
| 5,633,782 | A * | 5/1997 | Goodman et al. | 361/679.41 |
| 6,359,775 | B1 * | 3/2002 | Revis | 361/679.27 |
| 6,935,661 | B1 | 8/2005 | Farnsworth et al. | |
| 7,601,067 | B2 * | 10/2009 | Anderson | 463/46 |
| 7,835,150 | B2 | 11/2010 | Degner et al. | |
| 2003/0063432 | A1 | 4/2003 | Farrow et al. | |
| 2006/0038104 | A1 | 2/2006 | Choi | |
| 2007/0058329 | A1 | 3/2007 | Ledbetter et al. | |

(Continued)

FOREIGN PATENT DOCUMENTS

| | | |
|---|---|---|
| CN | 2891053 Y | 4/2007 |
| FR | 2803401 A3 | 7/2001 |

(Continued)

OTHER PUBLICATIONS

International Search Report and Written Opinion, international Application No. PCT/US2012/020797, Date of Mailing: Sep. 27, 2012, pp. 1-7.

(Continued)

*Primary Examiner* — Anthony Haughton

(74) *Attorney, Agent, or Firm* — Hewlett-Packard Patent Department

(57) ABSTRACT

An example display device includes a display device stand and display device housing pivotably connected to display device stand. The display device housing is to pivot between a vertical operating position and a horizontal servicing position, and a lid portion of the display device housing is to rotatably open away from a back portion of the display device housing to provide access to components within the display device housing.

20 Claims, 5 Drawing Sheets

10 38 12 14 26 25 20 28 23 22 18 16

(56) References Cited

U.S. PATENT DOCUMENTS

| | | | |
|---|---|---|---|
| 2007/0152125 | A1 | 7/2007 | Lee |
| 2008/0013268 | A1 | 1/2008 | Wong et al. |
| 2011/0025943 | A1 | 2/2011 | Cho |
| 2011/0058326 | A1 | 3/2011 | Idems et al. |

FOREIGN PATENT DOCUMENTS

| | | | |
|---|---|---|---|
| JP | 3105718 | U | 9/2004 |
| WO | 2011053309 | A1 | 5/2011 |

OTHER PUBLICATIONS

Karen Friar, “HP Pops Open Z1 All-in-one Workstation,” Feb. 16, 2012, pp. 1-2, ’ ZDNet.com.

NCR RealPOS 70xrt, POS Workstation Release 1.0 User Guide, 2008, pp. 1-148, NCR Corporation, Dayton, Ohio, USA.

Search Report, GB Application No. 1210166.3, Date Issued: Oct. 9, 2012, pp. 1-3.

* cited by examiner

DISPLAY DEVICE

CROSS-REFERENCE TO RELATED APPLICATIONS

This application is a continuation-in-part of International Application No. PCT/US2012/020797, filed Jan. 10, 2012, and incorporated herein by reference.

BACKGROUND

Consumers appreciate quality and value in electronic devices, Ease of use and serviceability are also desirable. Businesses, therefore, may want to create features and enhancements to their electronic devices directed towards one or more of these objectives.

BRIEF DESCRIPTION OF THE DRAWINGS

The following detailed description references the drawings, wherein.

DETAILED DESCRIPTION

Display devices commonly require servicing to replace or upgrade associated components. For example, a display device such as an all-in-one computer may require servicing to replace a defective hard drive or to add additional memory. This servicing generally requires access to the interior of the display device housing or enclosure. Gaining such access typically requires lifting the display device, which is oftentimes heavy for many end-users, and placing it in a servicing position, e.g., on a work surface. More specifically, this may involve placing the display device screen face-down, and removing securing fasteners to gain access to the components within the interior of the housing or enclosure. This procedure is less than optimal because, while the face-down position allows the end-user to gain access to the rear of the display device housing or enclosure, the position may cause damage to the display device screen if the end-user is not careful. Moreover, the end-user may be forced to carefully track removed fasteners to enable re-assembly of the display device. Still further, the end-user may be forced to lift the display device in order to service the device.

Various aspects of the present disclosure address at least the above-mentioned difficulties associated with servicing a conventional display device by providing a novel and previously unforeseen display device architecture that enables efficient and intuitive device servicing. More precisely, one example described in the present disclosure provides a display device architecture comprising a screen mounted on a stand such that the screen may be pivoted to a horizontally upwardly facing servicing position supported by the stand. In this servicing position, a display device lid comprising the display device screen may be rotated to an open position via a hinge assembly so as to allow access to components mounted within the interior of the display device, wherein such components remain substantially horizontal while in the servicing position for easy access, while at the same time avoiding damage to the display screen during servicing. In some examples, the above-mentioned display device is an all-in-one computer, understood herein to generally describe a computer that combines the central processing unit (CPU) and associated components (e.g., motherboard, memory, BIOS, power supply, and/or expansion cards) into the same enclosure or housing as the screen/monitor. In other examples, the display device is simply a monitor, liquid crystal display (LCD), plasma display, light emitted device (LED) display, or the like.

Figure 1:
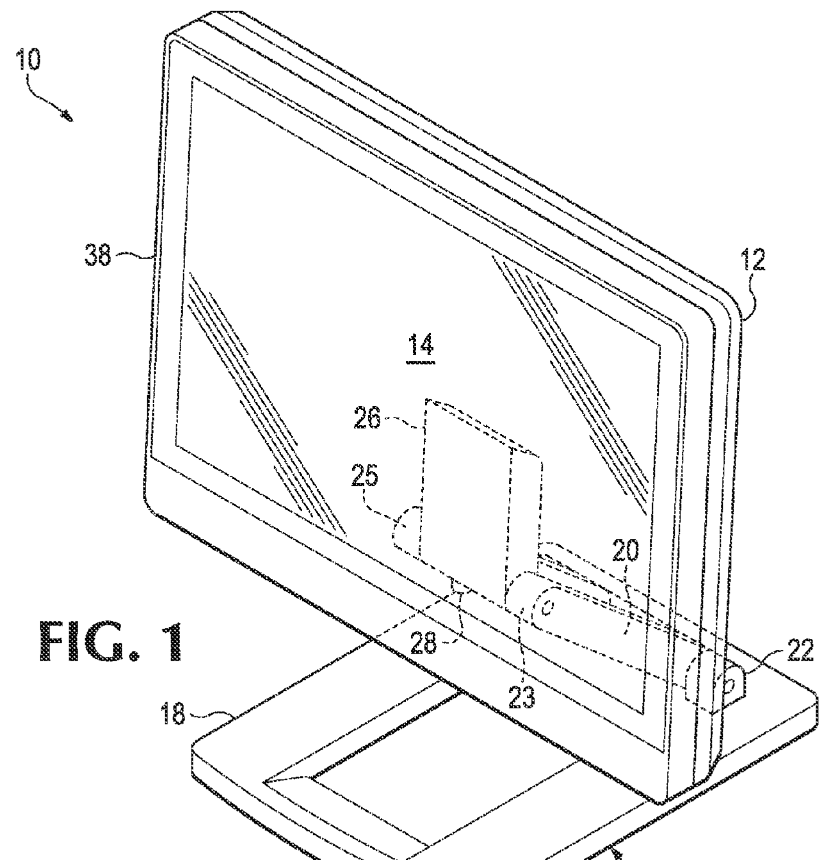
FIG. 1 depicts a perspective view of an example display device in a display or operating position.
Figure 2:
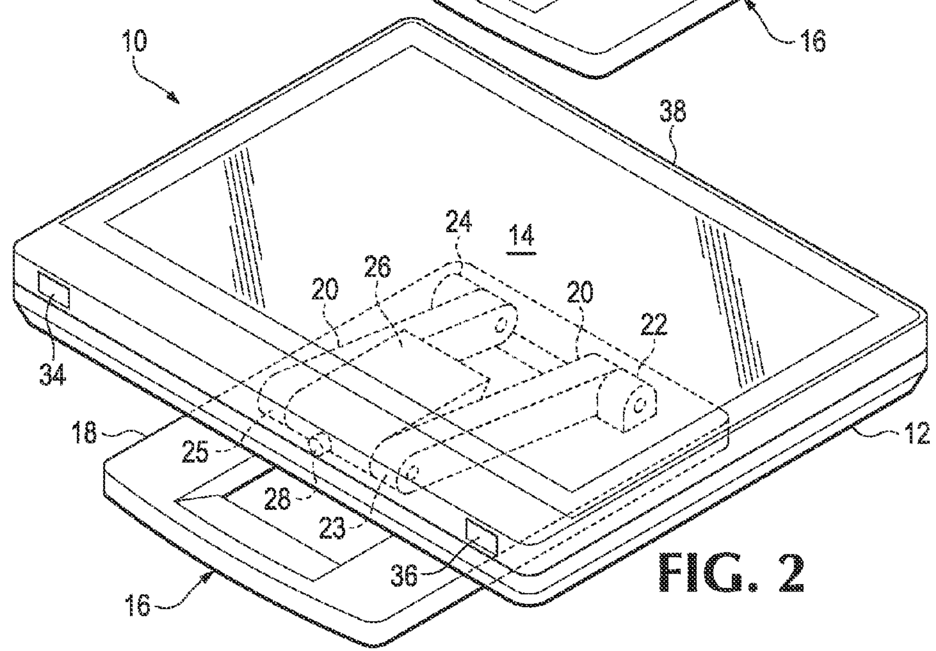
FIG. 2 depicts a perspective view of an example display device in a servicing position.

A perspective view of an example display device 10 is shown in FIGS. 1 and 2. More particularly, FIG. 1 depicts a perspective view of the example display device 10 in a display or operating position, and FIG. 2 depicts a perspective view of the example display device 10 in a servicing position. In the examples shown, the display device 10 is an all-in-one computer comprising an integral flat screen display component 14 that can display information to an end-user. In some implementations, this display screen component 14 may allow end-user data and control command input via touch-screen capabilities, while in other implementations the display screen component 14 may solely display information and not provide end-user input via touch. The display device 10 additionally comprises a housing or enclosure 12 that is configured to be movable between the operating or display position, shown in FIG. 1, in which the display screen component 14 is adjustably positionable for user convenience in a range of substantially vertical viewing positions, and a stable servicing position, shown in FIG. 2, in which the display screen component 14 is substantially horizontal and upwardly facing. The display device 10 further comprises a stand 16 with a support member or base 18 and an arm assembly 20 to support the housing or enclosure 12 in both the operating position and the servicing position, and to allow the housing or enclosure 12 to pivot between the operating position and the servicing position. The arm assembly 20 is rotatably coupled to the support member or base 18 by hinges 22 and 24 on support member 18 and to the housing or enclosure 12 by hinges 23 and 25 on the mount assembly 26. In some implementations, the arm assembly 20 is connected to the substantially central portion of the back of the housing or enclosure 12 via the mount assembly 26 to reduce the stress on the arm assembly 20 when the display device 10 is in the servicing position.

In the servicing position shown in FIG. 2, the housing or enclosure 12 may lie in a plane substantially parallel to support member or base 18. The arm assembly 20 may comprise a suitable lock mechanism (not shown) to releasably lock the housing or enclosure 12 in the servicing position shown in FIG. 2. A biased button 28 may be located on the mount assembly 26 and be manually depressed to unlock the housing or enclosure 12 and/or stand 16 such that the housing or enclosure 12 may be moved to the operating position shown in FIG. 1. It should be understood that, while two hinge assemblies 22/24 and 23/25 and a movable arm are shown in FIG. 3, other examples may utilize a single hinge assembly, more than two hinge assemblies, or a different hinge assembly to allow the housing or enclosure 12 to pivot between the operating position and the servicing position and that the arm assembly 20 may be fixed with respect to the base 18.

Figure 3:
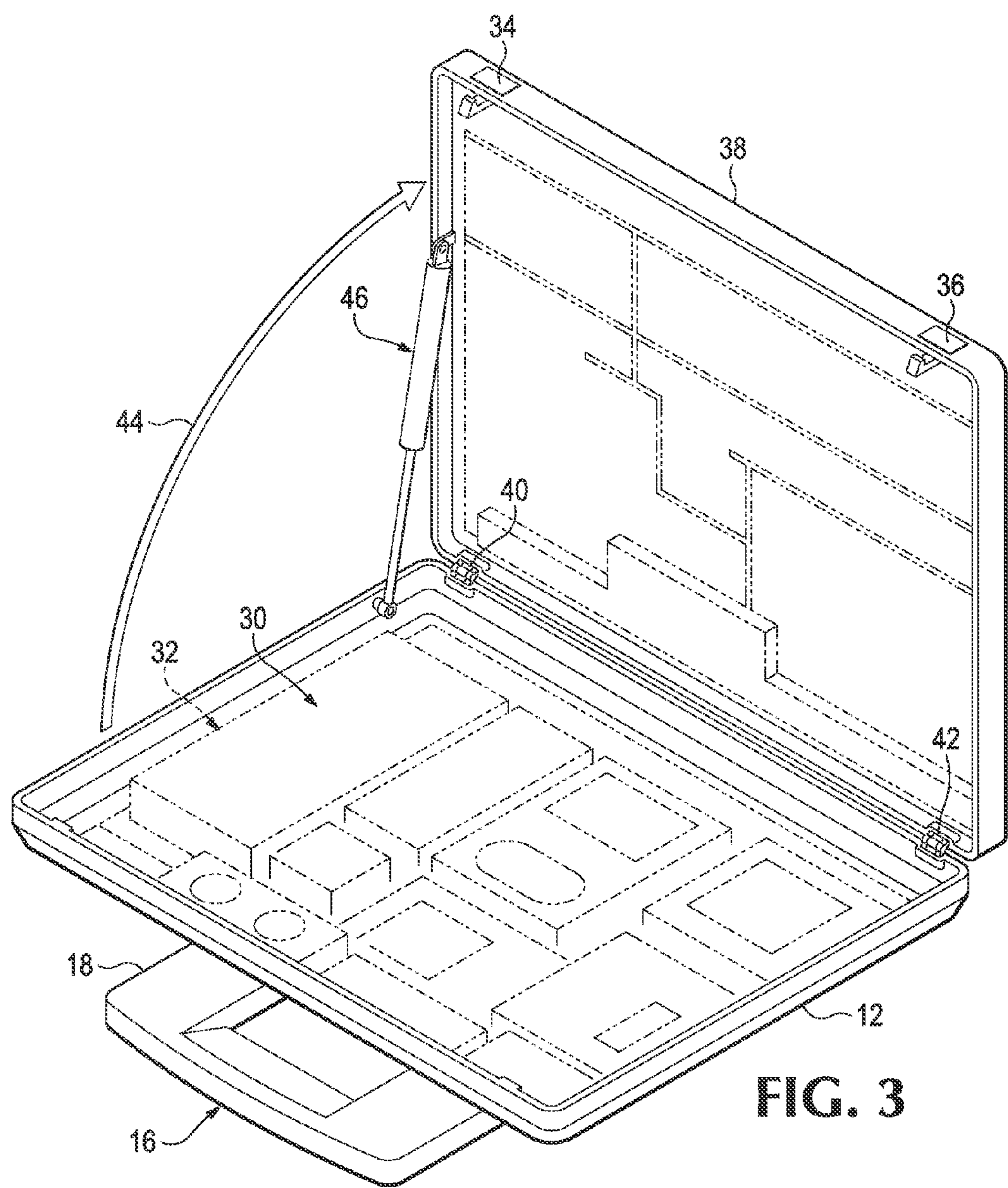
FIG. 3 depicts a perspective view of an example display device with an access panel or lid in an open position.

Turning now to FIG. 3, as discussed above, it may be necessary at times to obtain access to interior 30 of the display device 10 defined by housing or enclosure 12. For example, one or more of components 32 of display device 10 may need to be serviced or replaced (e.g., a defective hard drive). As another example, an end-user may desire to upgrade one or more components 32 of the display device 10 (e.g., adding additional memory). Gaining such access to the interior 30 may be accomplished by manually engaging latch assemblies 34 and 36 that releasably secure the access panel or lid 38 in the closed position shown in FIG. 2. The access panel or lid 38 forms part of housing or enclosure 12 and is configured to have an open position that provides access to the interior 30 in the servicing position, as shown in FIG. 3. In various implementations, the access panel or lid 38 may comprise the display screen component 14, as well as other components such as a camera. By contrast, the opposing area of the display device (i.e., the back portion of the display device housing or enclosure 12) may comprise components 32 such as, e.g., a motherboard, CPU, BIOS, hard drive, random access memory (RAM), graphics card, power supply, cooling fan, speakers, and/or ports.

As can be seen in FIG. 3, the display device 10 additionally includes hinge assemblies 40 and 42 coupled to the housing or enclosure 12 and the access panel or lid 38. The hinge assemblies 40 and 42 are configured to allow the access panel or lid 40 together with the flat screen display component 14 to be moved through an arc (generally indicated by arrow 44 in FIG. 3) from the closed position shown in FIGS. 1 and 2 to the open position shown in FIG. 3, rather like the lid of a suitcase or briefcase. Although two hinge assemblies 40 and 42 are shown in FIG. 3, it is to be understood that other examples may utilize a single hinge assembly, more than two hinge assemblies, or a different hinge assembly.

Figure 4:
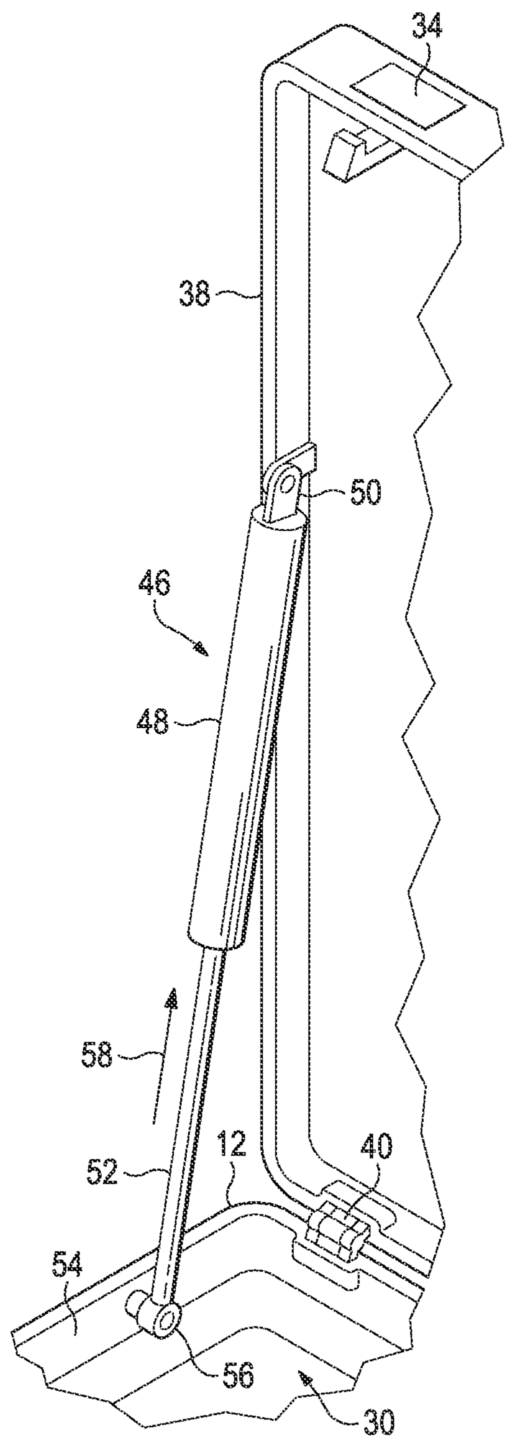
FIG. 4 depicts an enlarged view of an example lift assist.

As can further be seen in FIG. 3, display device 10 also includes a lift assist 46 that is configured to help move the access panel or lid 38 from the closed position shown in FIGS. 1 and 2 to the open position shown in FIG. 3 by at least partially supporting the weight of the lid 38 including the display screen component 14. An enlarged view of an example lift assist 46 is shown in FIG. 4. The lift assist 46 comprises a gas or pneumatic cylinder 48 movably coupled to access panel or lid 38 via a mount assembly 50. The lift assist 46 additionally comprises a rod 52 movably coupled to back 54 of housing or enclosure 12 via mount assembly 56. Lift assist 46 is configured to provide a force that pushes or urges the access panel or lid 38 into the open position, as generally indicated by arrow 58. This force 58, however, may be overcome by an end-user pushing on the access panel or lid 38 in a direction generally opposite that of arrow 58 which moves rod 52 within cylinder 48 and ultimately closes the access panel or lid 38. Mount assemblies 50 and 56 are configured so that the lift assist 46 retracts into the interior 30 of housing or enclosure 12 when the access panel or lid 38 is closed.

Figure 5:
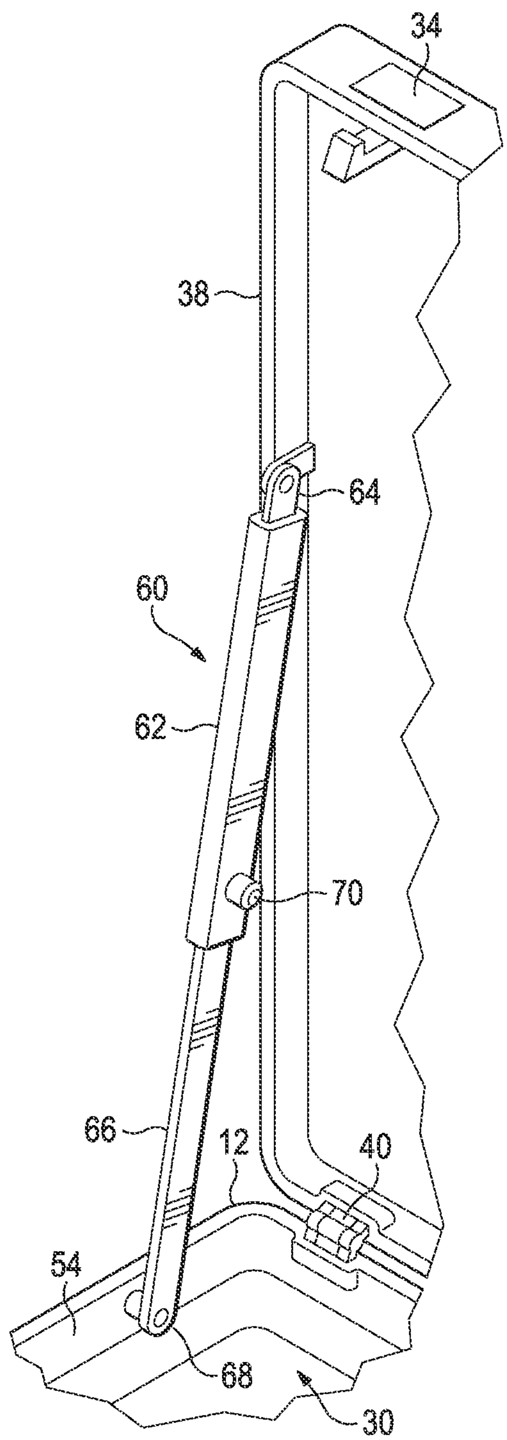
FIG. 5 depicts a view of an example sliding support.

An example sliding support 60 that may be used in place of the above-described lift assist 46 is shown in FIG. 5. As is apparent, the sliding support 60 comprises a casing 62 movably coupled to access panel or lid 38 via a mount assembly 64. The sliding support 60 additionally comprises a strut 66 movably coupled to the back or rear 54 of housing or enclosure 12 via the mount assembly 68. The strut 66 is designed to telescope out of the casing 62 as the access panel or lid 38 is moved to the open position, and to collapse into the casing 62 as the access panel or lid 38 is moved to the closed position. As can also be seen in FIG. 5, sliding support 60 further comprises a latch assembly 70 that secures the sliding support 60 in the extended position shown, The latch assembly 70 may include a biased pin that is releasably disposed in an opening (not shown). Alternatively, the latch assembly 70 may include a fastener that may be manually tightened in the extended position and manually loosened to retract and close the access panel or lid 38. Other configurations of the latch assembly 70 are also possible.

The mount assemblies 64 and 68 are configured so that the sliding support 60 retracts into the interior 30 of the housing or enclosure 12 when the access panel or lid 38 is closed. The sliding support 60 may also be configured to provide lift assist, as described above. For example, a biasing assembly (riot shown) that is disposed in the casing 62 and configured to be compressed when the access panel or lid 38 is in the closed position and uncompressed when access panel or lid 39 is in the open position may be provided.

Figure 6:
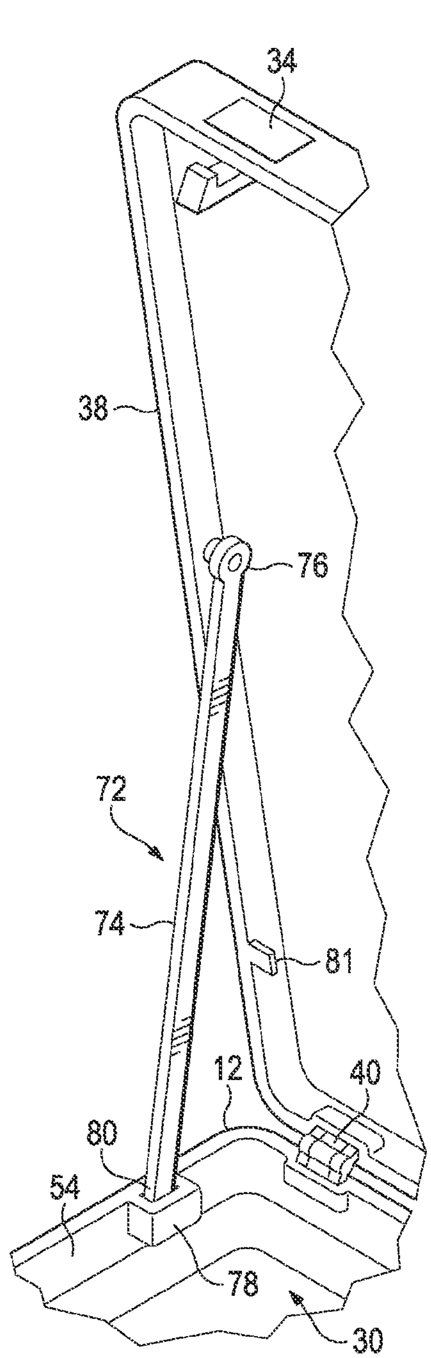
FIG. 6 depicts a view of an example rigid support in an extended position.
Figure 7:
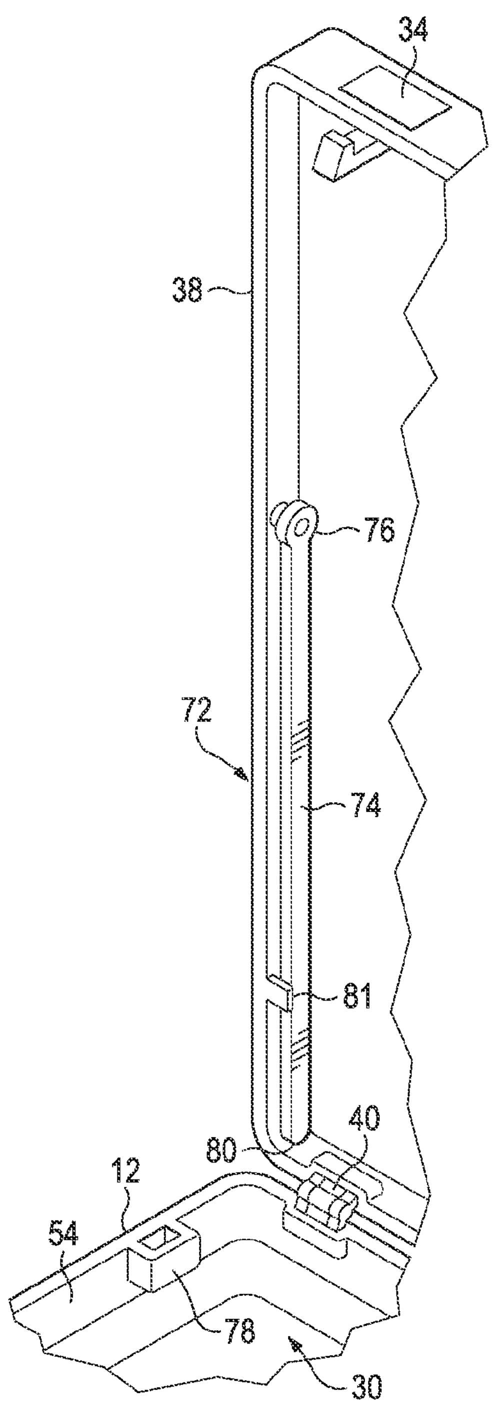
FIG. 7 depicts a view of the example rigid support of FIG. 6 in a retracted position.

An example rigid support 72 that may be used in place of the lift assist 46 or the sliding support 60 is shown in FIG. 6. As can be seen, the rigid support 72 comprises a strut 74 movably coupled to access panel or lid 38 via a mount assembly 76. The rigid support 72 additionally comprises a receptacle 78 wherein the strut end 80 may be disposed once the access panel or lid 38 is moved to the open position. This helps to secure the rigid support 72 in the extended position shown. The mount assembly 76 is configured so that the rigid support 72 may be retracted into interior 30 of housing or enclosure 12 when the access panel or lid 38 is closed by securing it with a tab 81, as shown in FIG. 7.

Figure 8:
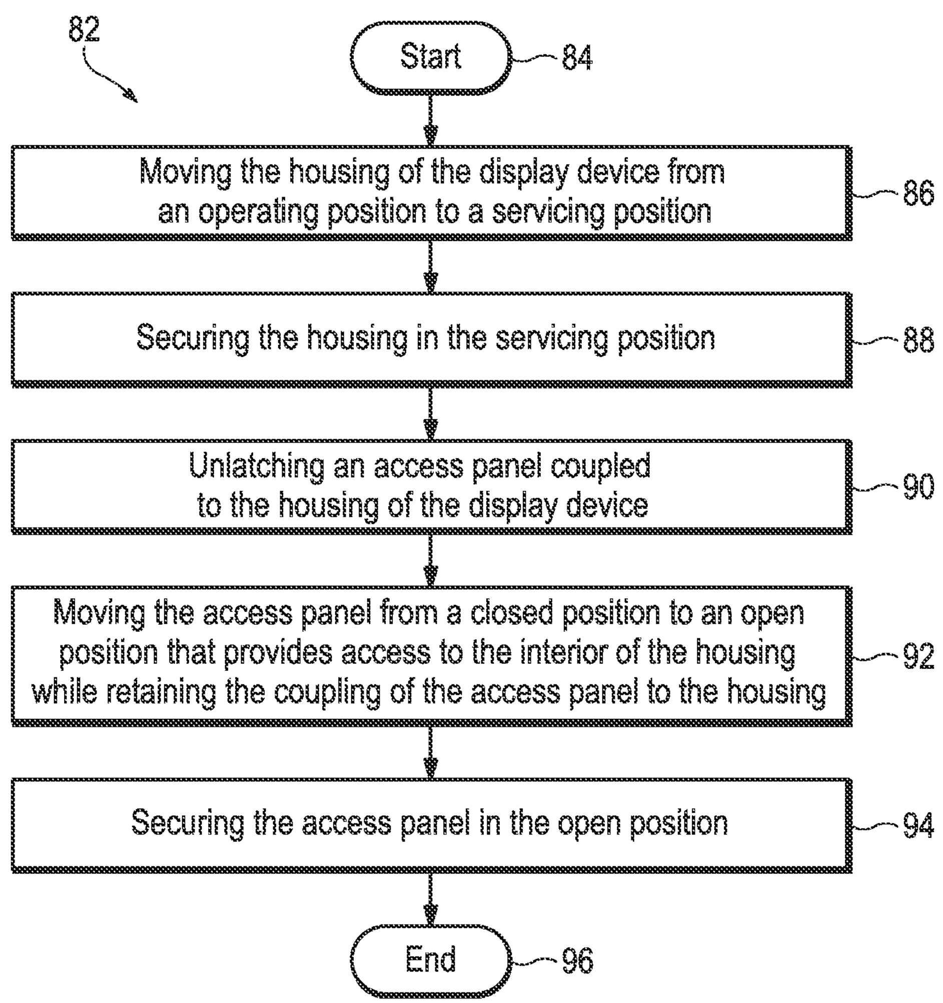
FIG. 8 describes an example method for accessing an interior of a display device.

A diagram of an example method 82 for accessing a display device is shown in FIG. 8. The method 82 may begin or start 84 by pivoting the housing of the display device from the operating position shown in FIG. 1 to the servicing position shown in FIG. 2. Next, the method 82 continues by the user securing the housing in the servicing position 88 and unlatching the access panel or lid 38 coupled to the housing of the display device 90. Next, the method 82 continues by lifting the access panel or lid 38 from a closed position to an open position to provide access to the interior of the housing and components therein while retaining the coupling of the access panel to the housing 92. Next, the method 82 continues by securing the access panel or lid 38 in the open position 94. The method 82 then may end 96. It should be understood that the above-described method 82 may include additionally processes beyond those illustrated and/or other example processes may omit one or more of disclosed processes and potentially utilize other processes instead.

The foregoing disclosure describes a novel and previously unforeseen display device architecture that enables efficient and intuitive display device servicing. In one example in accordance with the foregoing, a display device is provided. The display device comprises a display device stand and display device housing. The display device stand comprises a base portion and an arm assembly portion, and the display device housing comprises a back portion and a lid portion. The display device housing is connected to the arm assembly portion and is pivotable between a vertical operating position and a horizontal servicing position. The lid portion is releasably connected to the back portion and is rotatable with respect to the back portion via a hinge assembly to provide access to the interior of the display device housing. The lid portion comprises a display screen component.

In another example in accordance with the foregoing, an all-in-one computer is provided. The all-in-one computer comprises a display device stand and a display device housing. The display device stand comprises a base portion and an arm assembly portion, and the display device housing comprises a back portion and a lid portion and is pivotably connected to the display device stand. The lid portion comprises a display screen component, and is partially detachable from the back portion and rotatable with respect to the back portion via a hinge assembly connecting the lid portion and the back portion. The back portion comprises a motherboard, central processing unit, power supply, and memory.

In still another example in accordance with the present disclosure, a display device is provided. The display device comprises a display device stand and a display device housing pivotably connected to display device stand. The display device housing is to pivot between a vertical operating position and a horizontal servicing position, and a lid portion of the display device housing is to rotatably open away from a back portion of the display device housing to provide access to components within the display device housing.

Although several examples have been described and illustrated in detail, It is to be understood that the same are intended by way of illustration and example only, and are not intended to be exhaustive or to limit the design to the precise form or to the examples disclosed. Modifications and variations may well be apparent to those of ordinary skill in the art. For example, although the display device 10 has been illustrated as an all-in-one computer, other examples may include different configurations and/or functionality such as a display screen comprising serviceable components tethered to a separate computer or scanner.

Additionally, reference to an element in the singular is not intended to mean one and only one, unless explicitly so stated, but rather means one or more. Moreover, no element or component is intended to be dedicated to the public regardless of whether the element or component is explicitly recited in the following claims.

What is claimed is:

1. A display device, comprising: a display device stand comprising a base portion and an arm assembly portion; and a display device housing comprising a back portion and a lid portion, wherein the display device housing is connected to the arm assembly portion and is pivotable between a vertical operating position and a horizontal servicing position, wherein the lid portion is releasably connected to the back portion and is rotatable with respect to the back portion via a hinge assembly to provide access to the interior of the display device housing, wherein the lid portion comprises a display screen component wherein the display device housing is connected to the arm assembly via a mount assembly comprising a biased button; and wherein the display device comprises a support to support the lid portion when released from the back portion.

2. The display device of claim 1, wherein the display device comprises an all-in-one computer.

3. The display device of claim 1, wherein the display device housing is substantially parallel to the base portion when the display device housing is in the horizontal servicing position, and wherein the display device housing is substantially perpendicular to the base portion when the display device housing is in the vertical operating position.

4. The display device of claim 1, wherein the back portion comprises a motherboard, central processing unit, power supply, and memory.

5. The display device of claim 1, wherein the lid portion comprises a latch assembly that releasably secures the lid portion to the back portion.

6. The display device of claim 1, wherein the biased button, when depressed, unlocks the display device to enable a transition from the horizontal servicing position to the vertical operating position.

7. The display device of claim 1, wherein the support is one selected from a lift assist, a sliding support, and a rigid support to.

8. An all-in-one computer, comprising: a display device stand comprising a base portion and an arm assembly portion; and a display device housing pivotably connected to the display device stand and comprising a back portion and a lid portion, wherein the lid portion comprises a display screen component, wherein the back portion comprises a motherboard, central processing unit, power supply, and memory, wherein the lid portion is partially detachable from the back portion and rotatable with respect to the back portion via a hinge assembly connecting the lid portion and the back portion, wherein the display device housing is connected to the arm assembly portion via a mount assembly comprising a biased button; and wherein the display device comprises a support to support the lid portion when released from the back portion.

9. The all-in-one computer of claim 8, wherein the display device housing is pivotable between a vertical operating position and a horizontal servicing position.

10. The all-in-one computer of claim 9, wherein the display device housing is substantially parallel to the base portion when the display device housing is in the horizontal servicing position, and wherein the display device housing is substantially perpendicular to the base portion when the display device housing is in the vertical operating position.

11. The all-in-one computer of claim 9, further comprising a locking mechanism to lock the display device housing with respect to the display device when in the horizontal servicing position.

12. The all-in-one computer of claim 8, wherein the support is one selected from a lift assist, a sliding support, and a rigid support.

13. The all-in-one computer of claim 8, wherein the lid portion is able to rotate to a substantially perpendicular position with respect to the back portion when the lid portion is detached from the back portion.

14. The all-in one computer of claim 8, wherein the arm assembly portion is connected to the back portion in a substantially central portion of the back portion.

15. A display device, comprising: a display device stand; and a display device housing pivotably connected to display device stand, wherein the display device housing is to pivot between a vertical operating position and a horizontal servicing position, and wherein a lid portion of the display device housing is to rotatably open away from a back portion of the display device housing to provide access to components within the display device housing, wherein a first side of the lid portion is connected to a first side of the back portion via a hinge assembly, wherein the display device housing is connected to the arm assembly portion via a mount assembly comprising a biased button; and wherein the display device comprises a support to support the lid portion when released from the back portion.

16. The display device of claim 15, wherein a second side of the lid portion is connected to a second side of the back portion via a latch assembly.

17. The display device of claim 16, wherein the latch assembly is manually releasable.

18. The display device of claim 15, wherein the lid portion comprises a display screen component, and wherein the back portion comprises a motherboard, central processing unit, power supply, and memory.

19. The display device of claim 15, wherein the display device comprises an all-in-one computer.

20. The display device of claim 15, wherein the support is one selected from a lift assist, a sliding support, and a rigid support.

* * * * *